(12) United States Patent
Lee

(10) Patent No.: US 7,990,782 B2
(45) Date of Patent: Aug. 2, 2011

(54) DATA STROBE SIGNAL NOISE PROTECTION APPARATUS AND SEMICONDUCTOR INTEGRATED CIRCUIT

(75) Inventor: Sang Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 101 days.

(21) Appl. No.: 12/493,426

(22) Filed: Jun. 29, 2009

(65) Prior Publication Data
US 2010/0165760 A1    Jul. 1, 2010

(30) Foreign Application Priority Data

Dec. 30, 2008 (KR) .................. 10-2008-0136398

(51) Int. Cl.
*G11C 7/00* (2006.01)
(52) U.S. Cl. ............... 365/193; 365/233.5; 365/233.18; 365/233.1; 365/148; 365/149

(58) Field of Classification Search ............. 365/193, 365/233.5, 233.18, 233.1, 148, 149, 189.14
See application file for complete search history.

(56) References Cited

U.S. PATENT DOCUMENTS

| 6,862,248 | B2 | 3/2005 | Shin |
| 7,102,937 | B2 | 9/2006 | Mukherjee et al. |
| 7,143,258 | B2 | 11/2006 | Bae |
| 7,224,625 | B2 | 5/2007 | Dietrich et al. |
| 2008/0184095 | A1 * | 7/2008 | Lundberg ............... 714/814 |

FOREIGN PATENT DOCUMENTS

KR    1020070027810 A    3/2007

* cited by examiner

*Primary Examiner* — Thong Q Le
(74) *Attorney, Agent, or Firm* — Ladas & Parry LLP

(57) ABSTRACT

A data strobe signal noise prevention apparatus and semiconductor integrated circuit includes a transition protection unit configured to protect a transition of a data strobe signal in response to a control signal and a controller configured to determine when a burst operation completes and to generate the control signal.

20 Claims, 4 Drawing Sheets

DATA STROBE SIGNAL NOISE PROTECTION APPARATUS AND SEMICONDUCTOR INTEGRATED CIRCUIT

CROSS-REFERENCES TO RELATED PATENT APPLICATION

The present application claims priority under 35 U.S.C 119(a) to Korean Application No. 10-2008-0136398, filed on Dec. 30, 2008, in the Korean Intellectual Property Office, which is incorporated herein by reference in its entirety as set forth in full.

BACKGROUND

1. Technical Field

The embodiment described herein relates to a semiconductor circuit, and more particularly, to a data strobe signal noise protection apparatus and a semiconductor integrated circuit.

2. Related Art

A conventional semiconductor integrated circuit aligns data through a data input and output pad DQ to conform the data with a data strobe signal DQS and writes to a memory cell.

FIG. 1 is a timing diagram of a writing operation of a conventional semiconductor integrated circuit.

As shown in FIG. 1, the conventional semiconductor integrated circuit generates a data strobe signal DQS pulse during a burst operation period and generates ringing. Ringing is understood to be noise in a pulse form that occurs while changing the data strobe signal DQS pulse into high impedance Hi-Z state after a postamble.

The data alignment signals DSR2 and DSF2 are generated in synchronization with a rising edge and falling edge of the data strobe signal DQS. Conventional circuits generate abnormal DSR2 and SDF2 signals due to ringing.

Invalid data created with conventional circuits are latched as alignment data ALGN_R and ALGN_F by the abnormal data alignment signals DSR2 and DSF2, thereby causing a writing error that carries the invalid data on global data lines GIO_E and GIO_O.

SUMMARY OF THE INVENTION

A data strobe signal noise protection apparatus and a semiconductor integrated circuit capable of protecting a data writing error due to a data strobe signal are described herein.

According to one embodiment, a data strobe signal noise protection apparatus includes: a transition protection unit configured to protect the transition of a data strobe signal in response to a control signal; and a controller configured to determine when a burst operation completes and to generate the control signal.

According to another embodiment, a semiconductor integrated circuit includes: a buffer configured to receive data strobe signal and generate data alignment signals; a data writer configured to align data to the data alignment signals, to generate alignment data, and to transmit the alignment data to a memory cell through a data line; a transition protection unit configured to protect the transition of the data strobe signal in response to a control signal; and a controller configured to determine when a burst operation completes and to generate the control signal.

According to yet another embodiment, a semiconductor integrated circuit includes: a pad configured to receive a data strobe signal; a data writing path configured to transmit input data to a memory cell using the data strobe signal input through the pad; a transition protection unit configured to connect to an input terminal of the data writing path in parallel and to protect the transition of the data strobe signal input through the pad in response to the control signal; and a controller configured to determine when a burst operation completes and to generate the control signal.

These and other features, aspects, and embodiments are described below in the section "Detailed Description of the Invention."

BRIEF DESCRIPTION OF THE DRAWINGS

Features, aspects, and embodiments are described in conjunction with the attached drawings, in which.

DETAILED DESCRIPTION OF THE INVENTION

Hereinafter, exemplary embodiments of a data strobe signal noise protection apparatus and a semiconductor integrated circuit are described with reference to the accompanying drawings.

Figure 1:
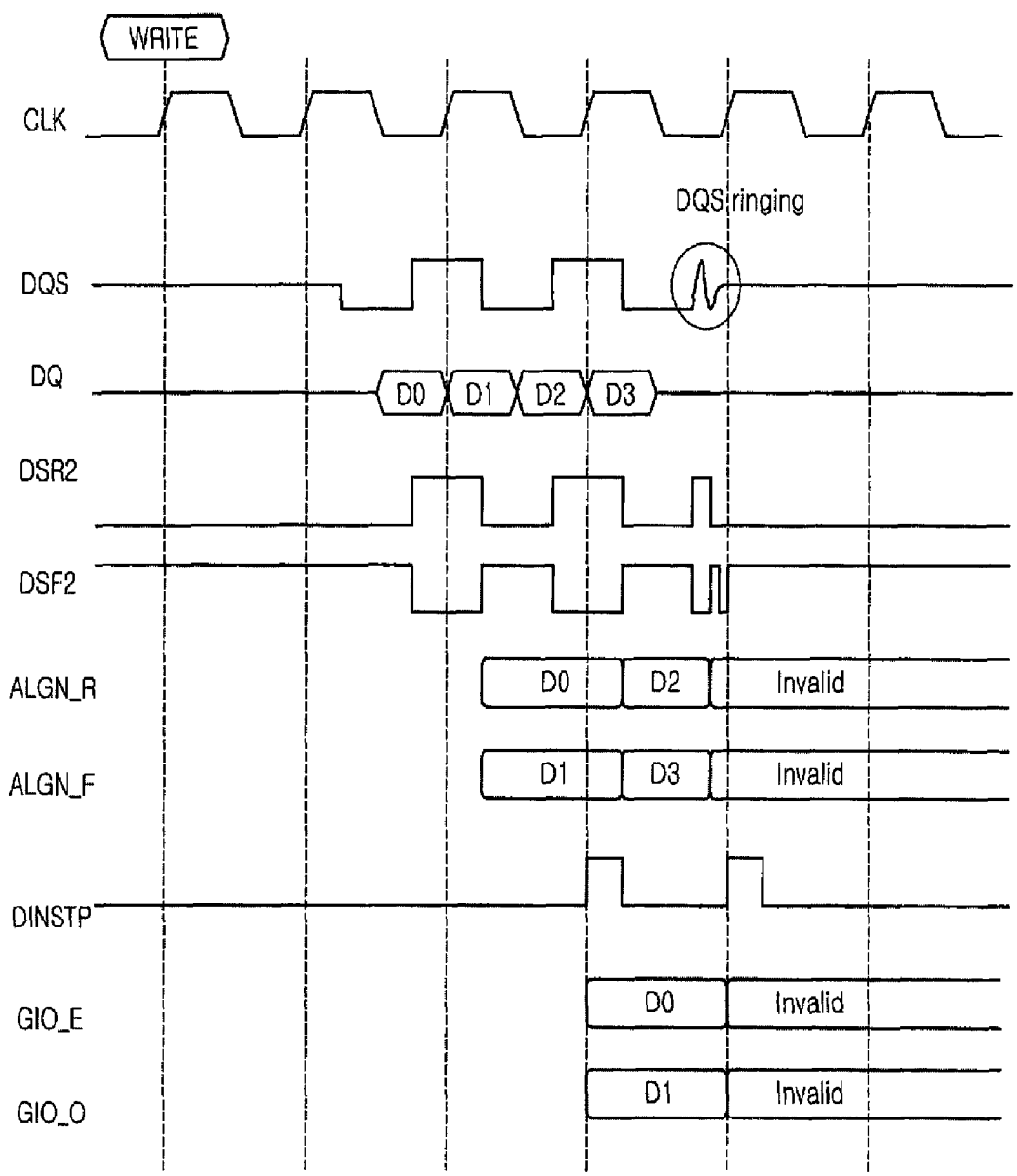
FIG. 1 is a timing diagram of a writing operation of a conventional semiconductor integrated circuit.
Figure 2:
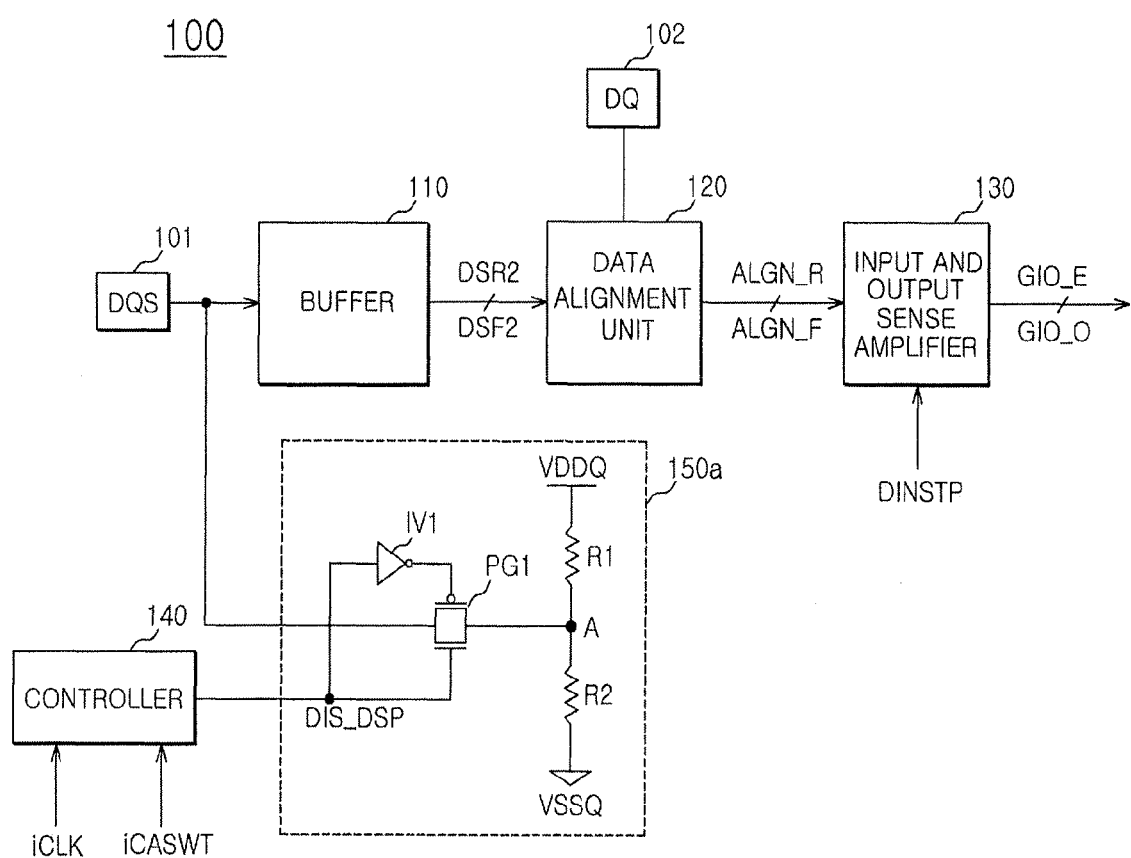
FIG. 2 is a block diagram of a semiconductor integrated circuit according to an embodiment.

FIG. 2 is a block diagram of a semiconductor integrated circuit according to one embodiment.

As described in FIG. 2, a semiconductor integrated circuit 100 is configured to include a DQS pad 101, a buffer 110, a DQ pad 102, a data alignment unit 120, an input and output sense amplifier 130, a controller 140, and a transition protection unit 150a.

The DQS pad 101 is configured to receive the data strobe signal DQS.

The DQ pad 102 is configured to receive data.

The buffer 110 is configured to generate data alignment signals DSR2 and DSF2 that are each synchronized with a rising edge and falling edge of the data strobe signal DQS input through the pad 101.

The data alignment unit 120 is configured to generate alignment data ALGN_R and ALGN_F by aligning the data input through the DQ pad 102 by a pipe latch according to the data alignment signals DSR2 and DSF2.

The input and output sense amplifier 130 is configured to sense/amplify the alignment data ALGN_R and ALGN_F according to the input strobe signal DINSTP and to transmit them to global data lines GIO_E and GIO_O.

The transition protection unit 150a includes an inverter IV1, a pass gate PG1, and divided resistors R1 and R2. The inverter IV1 receives a control signal DIS_DSP. The pass gate PG1 has a first control terminal that receives the output from the inverter IV1, a second control terminal that receives the control signal DIS_DSP, and an input terminal that is connected to the DQS pad 101. The divided resistors R1 and R2 are connected between a power terminal VDDQ and a ground terminal VSSQ, and a node A between the divided resistors R1 and R2 is connected to the output terminal of the pass gate PG1. A potential of VDDQ/2 is applied to the node A when the resistance values of the divided resistors R1 and R2 are the same.

The transition protection unit 150a connects the DQS pad 101 to the node A through the pass gate PG1 when the control signal DIS_DSP is activated. The data strobe signal DQS is short-circuited with the node A, which has the potential VDDQ/2 that is lower than the highest potential (for example, VDDQ) of the data strobe signal DQS, by connecting the DQS pad 101 with the node A, such that the abnormal transition of the data strobe signal DQS due to noise can be prevented.

The controller 140 is configured to activate the control signal DIS_DSP at the end point of the burst operation. The controller 140 shifts an internal write command iCASWT by a period tCK, an internal clock signal iCLK corresponding to a burst length BL, such that the activation timing of the control signal DIS_DSP matches the end point of the burst operation.

Figure 3:
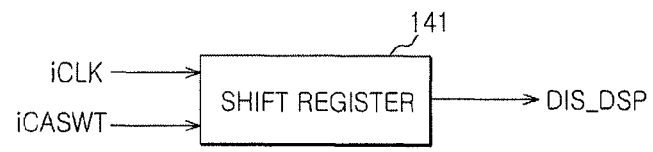
FIG. 3 is a circuit diagram of the controller of FIG. 2.

FIG. 3 is a circuit diagram of the controller of FIG. 2.

The controller 140 can be configured with a shift resistor 141 as shown in FIG. 3. When the burst length BL is 4 (BL4), then the internal write command iCASWT is shifted by 2 periods (2tCK) of the internal clock signal iCLK, and thus the activation timing of the control signal DIS_DSP can match the end point of the burst operation. Further, if the burst length BL is 8 (BL8), then the internal write command iCASWT is shifted by 4 periods (4Tck) of the internal clock signal iCLK, and thus the activation timing of the control signal DIS_DSP can match the end point of the burst operation.

The circuit of the shift register 141 is configured based on the BL4 and is configured to shift the internal write instruction iCASWT by 2 periods (2tCK) of the internal clock signal iCLK.

Figure 4:
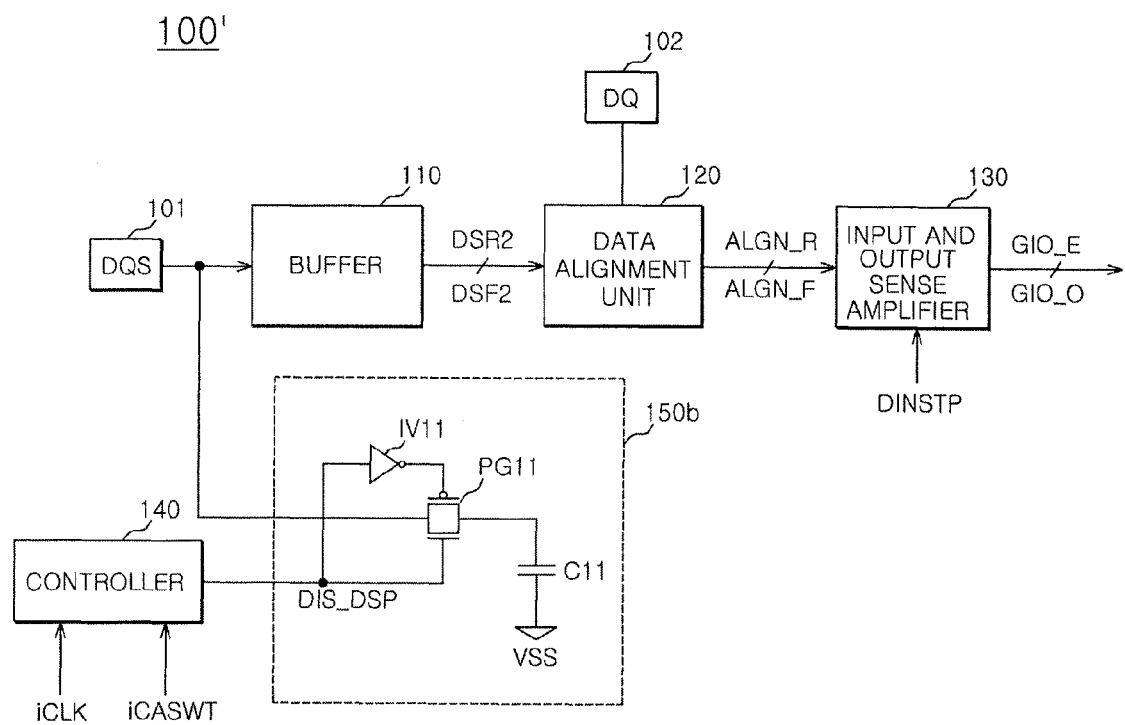
FIG. 4 is a block diagram of the semiconductor integrated circuit according to an embodiment.

FIG. 4 is a block diagram of a semiconductor integrated circuit according to another embodiment.

As shown in FIG. 4, a semiconductor integrated circuit 100' according to another embodiment includes the DQS pad 101, the buffer 110, the DQ pad 102, the data alignment unit 120, the input and output sense amplifier 130, the controller 140, and a transition protection unit 150b.

The DQS pad 101, the buffer 110, the data alignment unit 120, the input and output sense amplifier 130, and the controller 140 have the same configuration as FIGS. 2 and 3, and therefore, the configuration and operation description thereof is not repeated.

The transition protection unit 150b includes an inverter IV11, a pass gate PG11, and a decoupling capacitor C11. The inverter IV11 receives the control signal DIS_DSP. The pass gate PG11 has a first control terminal that receives the output from the inverter IV11, a second control terminal that receives the control signal DIS_DSP, and an input terminal that is connected to the DQS pad 101. One terminal of the decoupling capacitor C11 is connected to the output terminal of the pass gate PG11 and the other capacitor terminal is connected to the ground terminal VSSQ.

The transition protection unit 150b connects the DQS pad 101 to the decoupling capacitor C11 through the pass gate PG11 when the control signal DIS_DSP is activated. The data strobe signal DQS is short-circuited with the decoupling capacitor C11, which has a potential lower than the highest potential (for example, VDDQ) of the data strobe signal DQS, by connecting the DQS pad 101 with the decoupling capacitor C11, such that the abnormal transition of the data strobe signal DQS due to noise can be prevented.

Figure 5:
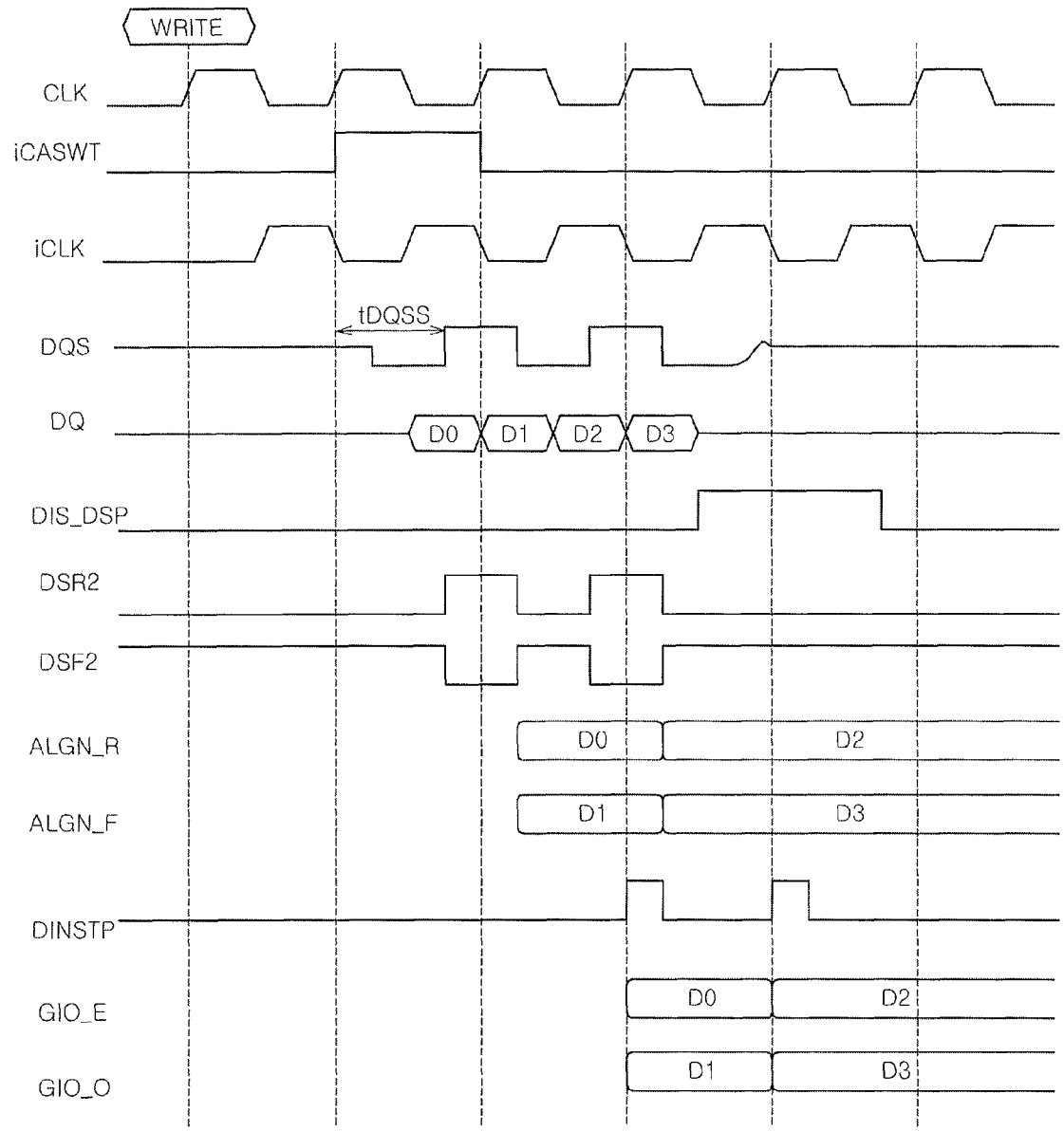
FIG. 5 is a timing diagram of a writing operation of the semiconductor integrated circuit according to an embodiment.

FIG. 5 is a timing diagram of a writing operation of the semiconductor integrated circuit according to an embodiment.

The data writing operation of the semiconductor integrated circuit according to the embodiment configured as above is described.

The following is an example of a case where the burst length BL is 4 (BL4).

The external write command is input and the data strobe signal DQS matching the burst length is generated after the defined standard time (tDQSS: a time defining the activation timing of the DQS based on a clock).

The data strobe signal DQS generates a pulse signal matching the burst length after the write command and is transitioned to a high impedance Hi-Z state after the postamble.

Data D0 to D3 are input through the DQ pad 102 so that they sequentially match the rising edge and falling edges of the data strobe signal DQS.

The buffer 110 generates the data alignment signals DSR2 and DSF2 that are synchronized with the rising edge and falling is edge of the data strobe signal DQS, respectively.

The data alignment unit 120 generates the alignment data ALGN_R and ALGN_F by aligning the data D0 to D3 to the data alignment signals DSR2 and DSF2.

The input and output sense amplifier 130 senses/amplifies the alignment data ALGN_R and ALGN_F to the input strobe signal DINSTP and transmits them to the global data lines GIO_E and GIO_O.

Meanwhile, the controller 140 shifts the internal write command iCASWT by 2 periods 2tCK of the internal clock signal iCLK corresponding to the BL4 to generate the control signal DIS_DSP activated at the end point of the burst operation. The internal write command iCASWT has a signal with a pulse width of one period of the internal clock signal 1CLK. Therefore, the control signal DIS_DSP is activated at the end point of the burst operation and is then deactivated after one period 1tCK of the internal clock signal iCLK. Therefore, the data strobe signal DQS can be normally transitioned according to a new write command.

Further, the activation time point of the control signal DIS_DSP is followed by the end point of the postamble period of the data strobe signal DQS.

The transition protection unit 150a short-circuits the data strobe signal DQS with the potential VDDQ/2 of the node A in response to the activation of the control signal DIS_DSP. Therefore, the potential of the data strobe signal DQS is changed so that it approaches the potential VDDQ/2 of the node A, as shown in FIG. 5.

The ringing generated while transitioning the data strobe signal DQS into the high impedance Hi-Z state after the postamble will be VDDQ. However, the control signal DIS_DSP is activated at the time point before the postamble period of the data strobe signal DQS ends, and thus, the DQS pad 101 and the node A become a short-circuit. Since the potential VDDQ/2 of the node is lower than the highest potential of the DQS pad 101, the potential of the data strobe signal DQS is changed as shown in FIG. 5, such that the abnormal transition of the data strobe signal DQS can be prevented.

Alternatively, the transition protection unit 150b short-circuits the data strobe signal DQS with the ground terminal VSSQ through the decoupling capacitor C11 in response to the activation of the control signal DIS_DSP. Therefore, the potential of the data strobe signal DQS is changed as shown in FIG. 5.

The ringing generated while transitioning the data strobe signal DQS into the high impedance Hi-Z state after the postamble will be VDDQ. However, the control signal DIS_DSP is activated at the time point before the postamble period of the data strobe signal DQS ends and thus, the DQS pad 101 and the decoupling capacitor C11 become a short-circuit. Since the potential VDDQ/2 of the decoupling capacitor C11, which is short-circuited with the DQS pad 101, is lower than the highest potential of the DQS pad 101, the potential of the data strobe signal DQS is changed as shown in FIG. 5, such that the abnormal transition of the data strobe signal DQS can be prevented.

While specific embodiments have been described above, it is understood that the embodiments described are by way of example only. Accordingly, the device and method described herein are not limited based on the described embodiments. Rather, the devices and methods described herein are only limited in light of the claims that follow when taken in conjunction with the above description and accompanying drawings.

What is claimed is:

1. A data strobe signal noise protection apparatus, comprising;
    a transition protection unit configured to protect a transition of a data strobe signal in response to a control signal; and
    a controller configured to activate the control signal when a burst operation completes.

2. The data strobe signal noise protection apparatus according to claim 1, wherein the transition protection unit is configured to short-circuit the data strobe signal with a potential lower than a highest potential of the data strobe signal in response to an activation of the control signal.

3. The data strobe signal noise protection apparatus according to claim 1, wherein the transition protection unit comprises:
    a transmitting device configured to receive the data strobe signal through a first terminal and receive the control signal by a control terminal; and
    a divided resistor that is connected to a second terminal of the transmitting device.

4. The data strobe signal noise protection apparatus according to claim 1, wherein the transition protection unit comprises:
    a transmitting device configured to receive the data strobe signal through a first terminal and receive the control signal by a control terminal; and
    a capacitor connected between a second terminal of the transmitting device and a ground terminal.

5. The data strobe signal noise protection apparatus according to claim 1, wherein the controller is configured to activate the control signal by shifting a write command by a period (tCK) of a clock signal according to a burst length.

6. The data strobe signal noise protection apparatus according to claim 3, wherein the first and second terminals are connected so as to short-circuit the data strobe signal with the divided resistor in response to the control signal.

7. The data strobe signal noise protection apparatus according to claim 4, wherein the first and second terminals are connected so as to short-circuit the data strobe signal with the capacitor in response to the control signal.

8. A semiconductor integrated circuit, comprising:
    a buffer configured to receive a data strobe signal and generate data alignment signals;
    a data writer configured to align data according to the data alignment signals to generate alignment data and transmits the alignment data to a memory cell through a data line;
    a transition protection unit configured to protect a transition of the data strobe signal in response to a control signal; and
    a controller configured to activate the control signal when a burst operation completes.

9. The semiconductor integrated circuit according to claim 8, wherein the transition protection unit is configured to short-circuit the data strobe signal with a potential lower than a highest potential of the data strobe signal in response to an activation of the control signal.

10. The semiconductor integrated circuit according to claim 8, wherein the transition protection unit comprises:
    a transmitting device configured to receive the data strobe signal through a first terminal and receive the control signal by a control terminal; and
    a divided resistor connected to a second terminal of the transmitting device.

11. The semiconductor integrated circuit according to claim 8, wherein the transition protection unit comprises:
    a transmitting device configured to receive the data strobe signal through a first terminal and receive the control signal by a control terminal; and
    a capacitor connected between a second terminal of the transmitting device and a ground terminal.

12. The semiconductor integrated circuit according to claim 8, wherein the controller is configured to activate the control signal by shifting a write command by a period (tCK) of a clock signal according to a burst length.

13. The semiconductor integrated circuit according to claim 8, wherein the buffer is configured to generate a signal synchronized with a rising edge and falling edge of the data strobe signal, respectively, as the data alignment signals.

14. The semiconductor integrated circuit according to claim 8, wherein the data writer comprises:
    a data alignment unit configured to align the data according to the data alignment signals and generate the alignment data; and
    an input and output sense amplifier configured to sense and amplify the alignment data and transmit to the memory cell through the data line.

15. A semiconductor integrated circuit, comprising:
    a pad configured to receive a data strobe signal;
    a data writing path configured to transmit input data to a memory cell using the data strobe signal;
    a transition protection unit configured to be connected to an input terminal of the data writing path in parallel and protects the transition of the data strobe signal in response to the control signal; and
    a controller configured to activate the control signal when a burst operation completes.

16. The semiconductor integrated circuit according to claim 15, wherein the transition protection unit is configured to short-circuit the data strobe signal with a potential lower than the highest potential of the data strobe signal.

17. The semiconductor integrated circuit according to claim 15, wherein the transition protection unit comprises:
    a transmitting device configured to receive the data strobe signal through a first terminal and receive the control signal by a control terminal; and
    a divided resistor connected to a second terminal of the transmitting device.

18. The semiconductor integrated circuit according to claim 15, wherein the transition protection unit comprises:
    a transmitting device configured to receive the data strobe signal through a first terminal and receive the control signal by a control terminal; and
    a capacitor connected between a second terminal of the transmitting device and a ground terminal.

19. The semiconductor integrated circuit according to claim 15, wherein the controller is configured to activate the control signal by shifting a write command by a period (tCK) of a clock signal according to a burst length.

20. The semiconductor integrated circuit according to claim 15, wherein the data writing path comprises:
 a buffer configured to receive the data strobe signal and generate the data alignment signal;
 a data alignment unit configured to align the data according to the data alignment signal and generate the alignment data; and
 an input and output sense amplifier configured to sense and amplify the alignment data and transmit to the memory cell.

* * * * *